United States Patent [19]
Hashimoto et al.

[11] Patent Number: 5,332,688
[45] Date of Patent: Jul. 26, 1994

[54] METHOD OF MANUFACTURING FULL CMOS TYPE SRAM

[75] Inventors: Makoto Hashimoto; Yoshihiro Miyazawa; Takeshi Matsushita, all of Kanagawa, Japan

[73] Assignee: Sony Corporation, Tokyo, Japan

[21] Appl. No.: 855,663

[22] Filed: Mar. 23, 1992

[30] Foreign Application Priority Data

Mar. 23, 1991 [JP] Japan ................................. 3-083129
Mar. 23, 1991 [JP] Japan ................................. 3-083130

[51] Int. Cl.⁵ ............................................. H01L 21/70
[52] U.S. Cl. .................................... 437/57; 437/52; 257/369
[58] Field of Search ................... 437/57, 52; 257/369

[56] References Cited

U.S. PATENT DOCUMENTS

| | | | |
|---|---|---|---|
| 4,740,479 | 4/1988 | Neppl et al. | 437/56 |
| 4,805,148 | 2/1989 | Diehl-Nagle et al. | 257/297 |
| 4,890,141 | 12/1989 | Tang | 257/372 |
| 4,904,200 | 1/1991 | Saitoo et al. | 437/52 |
| 5,051,812 | 9/1991 | Onuki et al. | 357/71 |
| 5,128,731 | 7/1992 | Lien et al. | 257/401 |

FOREIGN PATENT DOCUMENTS

| | | |
|---|---|---|
| 0016577 | 10/1980 | European Pat. Off. . |
| 0349021 | 1/1990 | European Pat. Off. . |
| 2089121 | 6/1982 | United Kingdom . |
| 2244176A | 11/1991 | United Kingdom . |

Primary Examiner—Olik Chaudhuri
Assistant Examiner—Long Pham
Attorney, Agent, or Firm—Hill, Steadman & Simpson

[57] ABSTRACT

A method for manufacture of a full CMOS type SRAM, comprising the steps of forming a first mask layer on a semiconductor layer, and patterning the first mask layer by photolithography to form semiconductor island layers where a driver MOS transistor and a load MOS transistor are formable with a slight space therebetween; forming a second mask layer on the semiconductor layer, and patterning the second mask layer by photolithography in such a manner as to overlap the region with one of the driver and load MOS transistors, but not to overlap the isolating region between the transistors; masking, with a resist film, the region with the other of the driver and load MOS transistors, and etching the first mask layer while masking the same with the resist film and the second mask layer; and etching the semiconductor layer while masking the same with the first mask layer, thereby forming mutually isolated semiconductor island layers where the driver and load MOS transistors are formed respectively. According to this method, the width of each transistor and the space between the transistors can be minimized to consequently achieve an enhanced integration density.

3 Claims, 6 Drawing Sheets

METHOD OF MANUFACTURING FULL CMOS TYPE SRAM

BACKGROUND OF THE INVENTION

1. Field of the Invention

The present invention relates to a semiconductor memory device such as an SRAM (static random access memory) and a method of manufacturing the same, inclusive of forming a wiring arrangement therein.

2. Description of the Prior Art

It is generally known that SRAMs are classified into high-resistance load type, TFT load type and full CMOS type, of which the former two types are advantageous in the point that the memory cell size is reducible, and therefore these types are considered dominant in the recent 4-Mbit and 16-Mbit SRAMs.

In comparison therewith, the cell size in the full CMOS type SRAM tends to be greater since six MOS transistors are required per cell.

In any SRAM of the high-resistance load type and TFT load type, it is difficult to enhance the operating stability of each cell and the soft error tolerance. Meanwhile the full CMOS type SRAM has an advantage that the operating stability of each cell and the soft error tolerance can be enhanced. It is therefore urgently requisite to raise the integrating density of the full CMOS type SRAM as high as possible. In order to meet such requirements, it is apparently preferred that an SRAM be composed of an SOI type semiconductor device, since in an SOI layer, a p-channel MOS transistor and an n-channel MOS transistor can be formed relatively in the proximity of each other. However, due to the fact that reduction of both the width of each MOS transistor and the interval between adjacent MOS transistors is restricted by the resolution of photolithography, it has been eventually impossible heretofore to attain high-density integration differently from the high-resistance load type or TFT load type SRAM.

In the SRAM, it is necessary to supply a power to each of memory cells. When data is written in a memory cell, a current flows from a power line to a bit line via a load means (a high resistance load or a load MOS transistor) and a switching (word) MOS transistor. The current reaches its maximum at the data writing time, and consequently a voltage drop is caused in the power line. Such voltage drop is equivalent to the product of the maximum current and the parasitic resistance of the power line. And it is necessary to minimize the value of such voltage drop.

In a SRAM where the load is a high-resistance element of polycrystal silicon, the current flowing from the power line to the bit line at the data writing time can be sufficiently reduced since the load has a high resistance value, so that the power line may be composed of polycrystal silicon whose sheet resistivity is relatively high. And practically, polycrystal silicon is used to compose the power line.

Meanwhile, in a full CMOS type SRAM where an n-channel MOS transistor is employed as a driver transistor and a p-channel MOS transistor as a load transistor respectively, the current I flowing at the writing time becomes considerably great as the load consists of a p-channel MOS transistor. Therefore a great voltage drop occurs in the power line unless the resistance R of the power line is reduced to an extremely small value. Although such full CMOS type SRAM has a problem of a great voltage drop in the power line, there also exists a remarkable advantage with regard to superior operating stability of each cell and a high soft error tolerance.

In an exemplary case of a 4-Mbit full CMOS type SRAM where the current I flowing in one cell at a data writing time is approximately 60 μA, the maximum voltage drop caused in a power line is expressed as $$\Delta V = 8RI$$

Multiplying the value RI by 8 is based on the reason that the data is written in 8-bit cells simultaneously.

The maximum permissible value of the voltage drop $\Delta V$ caused in the power line is not so great if there are taken into consideration the supply voltage variations and the conditions (determined principally by the current driving capabilities of both transistors in the inverter) where an inverter (constituting a flip-flop) in the memory cell performs its proper function. Supposing now that the maximum permissible voltage drop is 1 V, the resistance R of the power line to satisfy this condition is expressed as follows with the margin ignored.

$$R \leq \tfrac{1}{8} \cdot I \approx 2000 \, [\Omega]$$

It signifies that the resistance R of the power line needs to be less than 2 kΩ. However, considering the necessity to ensure the margin, it is practically requisite that the resistance R should be smaller than 1 kΩ.

In the full CMOS type SRAM, therefore, it is customary that the power line 1 for supplying a power directly to cells $a_1, a_2, \ldots a_n$ as shown in FIG. 1 is composed of aluminum likewise the aforementioned power line 2.

However, if the power line 1 for supplying a power directly to the cells $a_1, a_2, \ldots a_n$ is also composed of aluminum similarly to the power line 2 as described above, it follows that the area occupied by the cell array becomes wide to consequently raise a problem of difficulty in attaining a high integration density of the RAM.

Such technical difficulty is derived from the fact that some other elements to be composed of a first aluminum film 1Al are also existent in the RAM. It is generally customary that bit lines are composed of a second aluminum film 2Al, whereas a ground line and a main word line need to be composed of the first aluminum film 1Al. In case even the power line 1 in FIG. 1 is also composed of the film 1Al, the desired high integration density of the RAM is hardly realizable due to the necessity of ensuring the required line and space (L & S) of the film 1Al.

In an exemplary case where a main word line is composed of an aluminum film 1Al, it is ordinary that a word line is composed of polycrystal silicon. However, in an SRAM based on a divided word line system, a main word line is composed of an aluminum film 1Al while a section word line is composed of polycrystal silicon. And in any 1-Mbit or 4-Mbit SRAM, the divided word line system is adopted.

Thus, in the constitution where the power line for supplying a required voltage directly to each memory cell is composed of an aluminum film 1Al, it is difficult to attain a further higher integration density.

OBJECTS AND SUMMARY OF THE INVENTION

It is a first object of the present invention to provide an improved method of manufacturing a full CMOS type SRAM of a high integration density by minimizing the width of each of driver MOS transistors and load MOS transistors and also the interval between adjacent MOS transistors beyond the limit determined by the resolution of photolithography, hence achieving an enhanced integration density similarly to a high-resistance load type or a TFT load type SRAM.

And a second object of the present invention is to provide an SRAM with an improved semiconductor device wherein a low-resistance wiring arrangement can be realized to reduce the parasitic resistance of a power line, a ground line and so forth even by the use of a material of a great sheet resistivity.

According to one aspect of the present invention, there is provided a method of manufacturing a full CMOS type SRAM, comprising the steps of: forming a first mask layer on a semiconductor layer, and patterning the first mask layer by photolithography to form semiconductor island layers where a driver MOS transistor and a load MOS transistor are formable while being slightly spaced apart from each other; forming a second mask layer on the semiconductor layer inclusive of the first mask layer, and patterning the second mask layer by photolithography in such a manner as to overlap the region where one of the driver MOS transistor and the load MOS transistor in the first mask layer is formed, but not to overlap the isolating region between the driver MOS transistor and the load MOS transistor; masking, with a resist film, the region where the other of the driver MOS transistor and the load MOS transistor in the first mask layer is formed, and etching the first mask layer while masking the same with the resist film and the second mask layer; and etching the semiconductor layer while masking the same with the first mask layer, thereby forming mutually isolated semiconductor island layers where the driver MOS transistor and the load MOS transistor are formed respectively.

According to another aspect of the present invention, there is provided an SRAM with a semiconductor device wherein a conductive layer is formed, through an insulator film, substantially on one entire surface of a semiconductor layer with semiconductor elements formed therein, and the conductive layer is connected to the semiconductive elements via contact holes in the insulator film, thereby forming a wiring arrangement. Such conductive layer formed substantially on one entire surface is used as a power wiring arrangement or a ground wiring arrangement in the semiconductor device.

The above and other features and advantages of the present invention will become apparent from the following description which will be given with reference to the illustrative accompanying drawings.

DESCRIPTION OF THE PREFERRED EMBODIMENTS

Hereinafter a first embodiment of the present invention relative to a method for manufacture of a full CMOS type SRAM will be described in detail with reference to the accompanying drawings.

FIGS. 2(A) through 2(D) are sectional views representing sequential process steps of an exemplary embodiment to carry out the method of manufacturing a full CMOS type SRAM according to the present invention; FIG. 3(A) is a plan view of a principal component layout in an example of applying the method of the present invention; and FIG. 3(B) is a circuit diagram of memory cells shown in FIG. 3(A). The sectional views of FIGS. 2(A) through 2(D) are taken along the line 20—20 in FIG. 3(A).

Figure 2A:
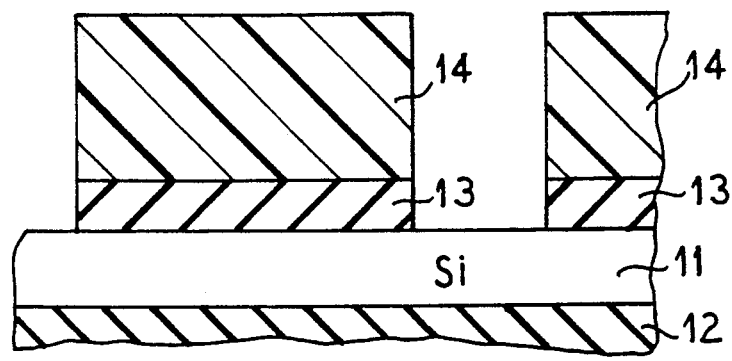
FIGS. 2 (A) through 2 (D) are sectional views representing sequential process steps of an exemplary embodiment to carry out a method for manufacture of a full CMOS type SRAM according to the present invention.
Figure 3A:
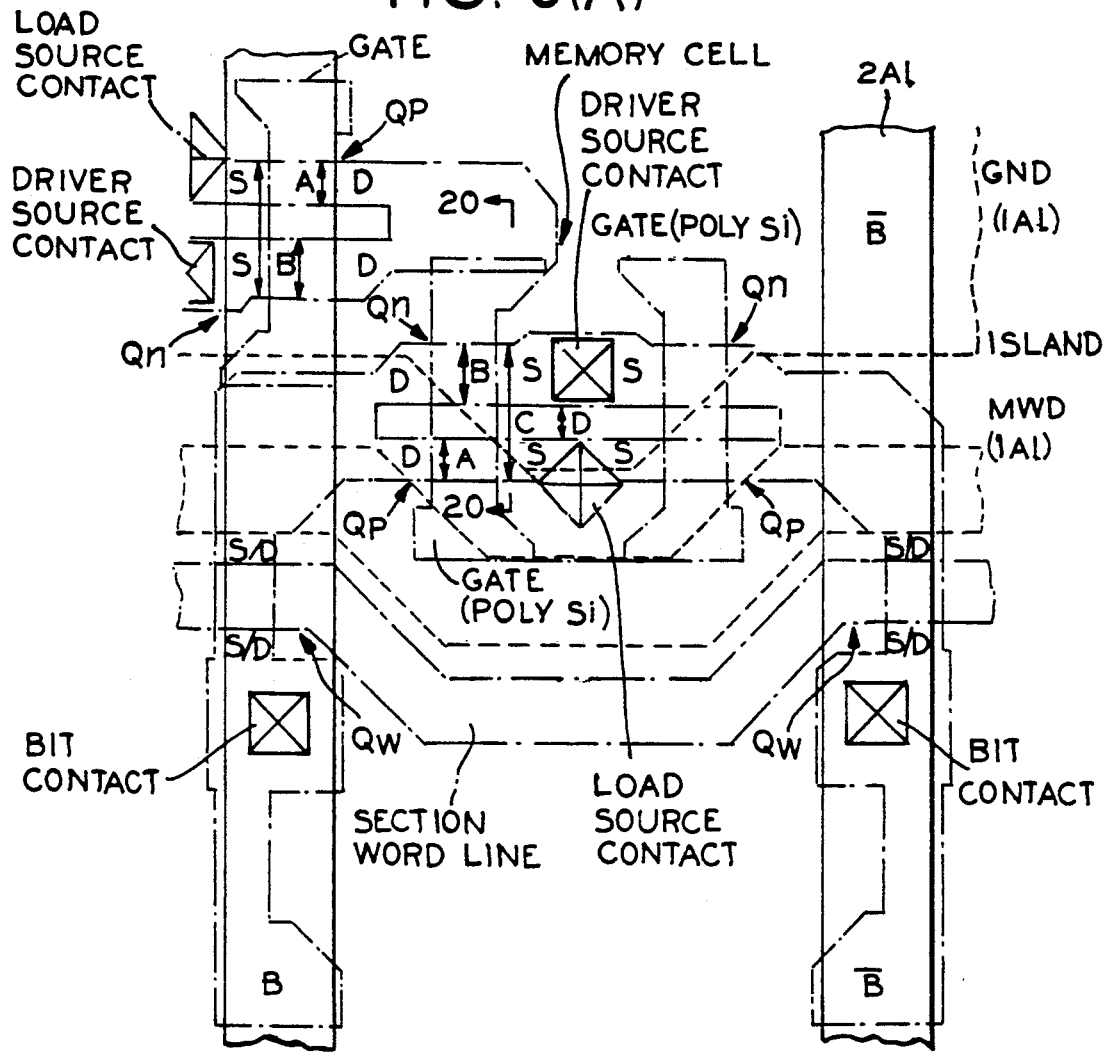
FIG. 3(A) is a plan view of a principal component layout in an example of applying the method of the present invention.
Figure 3B:
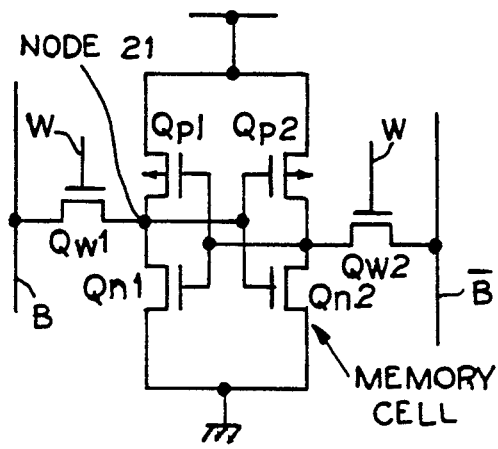
FIG. 3(B) is a circuit diagram of memory cells shown in FIG. 3(A)

In FIG. 2(A), a first mask layer 13 of silicon dioxide ($SiO_2$) is formed on the entire surface of an SOI layer 11, and the first mask layer 13 is etched to be patterned while being masked with a resist film 14.

The first mask layer 13 has an adequate pattern and size suited to obtain semiconductor island layers where a driver MOS transistor (width B) and a load MOS transistor (width A) are to be formed respectively.

Denoted by 12 is an insulator film which serves as a foundation for the SOI layer 11. FIG. 2(A) illustrates a state after the step of patterning the first mask layer 13.

Subsequently in FIG. 2(B), the resist film 14 is removed, and then a second mask layer 15 of $Si_3N_4$ is formed. Thereafter the second mask layer 15 is etched while being masked with a resist film 16. In this case, the second mask layer 15 is so patterned as to cover a region where one of a driver MOS transistor and a load MOS transistor, e.g. a load MOS transistor, is to be formed, but not to cover a portion which serves as an isolating region between the driver MOS transistor and the load MOS transistor. Consequently the overlapped portion of the semiconductor island layer 13 and the second mask layer 15 becomes a region where either the driver MOS transistor or the load MOS transistor, e.g. the load MOS transistor in this embodiment, is to be formed.

Figure 2B:
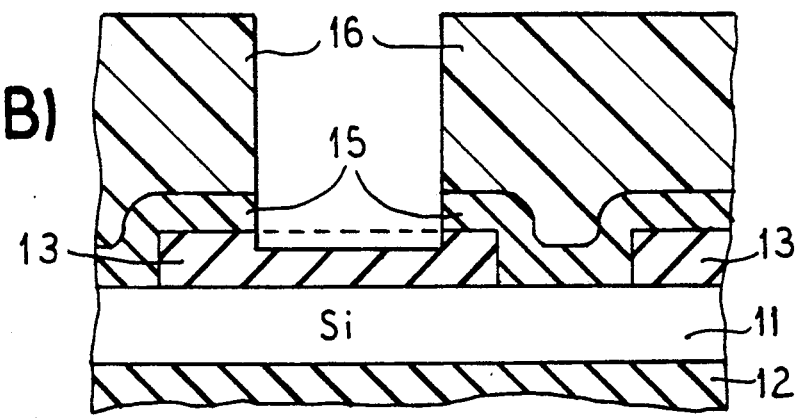

FIG. 2(B) illustrates a state after the step of etching the second mask layer 15.

Figure 2C:
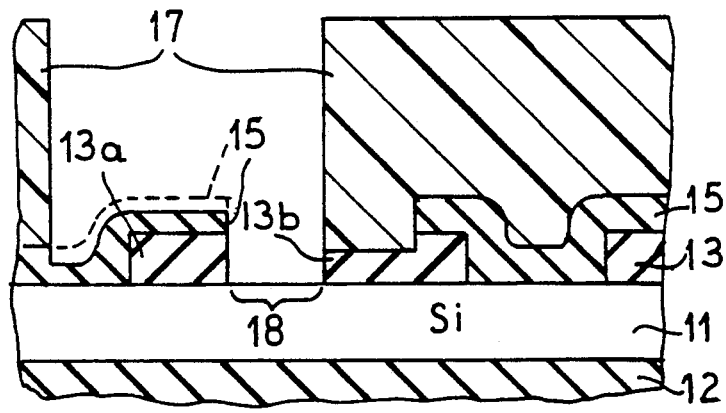

Next in FIG. 2(C), the resist film 16 is removed, and then another resist film 17 is selectively formed. The resist film 17 is so patterned as to completely cover a region where the other of the driver MOS transistor and the load MOS transistor, e.g. the driver MOS transistor in this embodiment, is to be formed, but not to cover a portion 18 which serves as an isolating region between the driver MOS transistor and the load MOS transistor.

Thereafter the first mask layer 13 is etched while being masked with both the resist film 17 and the second mask layer 15, whereby the portion corresponding to the isolating region between the driver MOS transistor and the load MOS transistor on the first mask layer 13 is removed. A portion 13a is used to mask the region of the first mask layer 13 for forming one of the driver MOS transistor and the load MOS transistor, e.g. the load MOS transistor in this embodiment; while a portion 13b is used to mask the region of the first mask layer 13 for forming the other of the driver MOS transistor and the load MOS transistor, e.g. the driver MOS transistor in this embodiment. FIG. 2(C) illustrates a state after the step of forming the portions 13a and 13b by selectively etching the first mask layer 13.

Figure 2D:
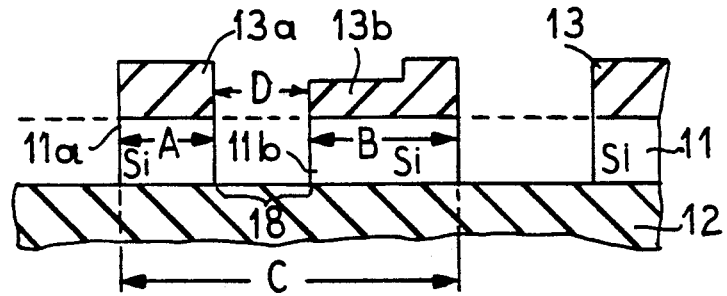

Subsequently in FIG. 2(D), the resist film 17 is removed, and further the second mask layer 15 is also removed. Then the semiconductor layer 11 is etched while being masked with the first mask layer 13, thereby forming a semiconductor island layer 11a where the load MOS transistor is to be formed, and also a semiconductor island layer 11b where the driver MOS transistor is to be formed. Denoted by 18 is an isolating region between the semiconductor island layers 11a and 11b. FIG. 2(D) illustrates a state after the step of etching the semiconductor layer 11. In this specification, the semiconductor island layer is defined as an isolated island-shaped semiconductor which is independent of any other semiconductor, and there exists no distinction in the definition as to whether it is an SOI layer or a polycrystal silicon layer.

FIG. 3(A) is a plan view of a principal component layout in an exemplary SOI type SRAM embodying the semiconductor device of the present invention. In this diagram, a two-dot chained line denotes an island composed of an SOI layer, while a one-dot chained line denotes gates of a driver MOS transistor Qn and a load MOS transistor Qp composed of polycrystal silicon, and another one-dot chained line denotes a section word line including a gate of a switching MOS transistor Qw. Further a broken line denotes a first aluminum film 1Al, while a solid line denotes a second aluminum film 2Al.

A wiring layer to be in contact with a source of the load MOS transistor Qp is composed of a polycrystal silicon layer below the SOI layer formed on the entire surface under a memory cell array, and therefore such wiring layer does not appear in FIG. 3.

Although an n-type impunity is diffused in both sources and drains of the driver MOS transistor Qn and the switching (word) MOS transistor Qw with the gates thereof being used as a mask, such impurity-diffused regions are not shown since the diagram will be complicated.

According to the above method of manufacturing a full CMOS type SRAM, the width C of the semiconductor island layer with the driver MOS transistor and the load MOS transistor formed therein is determined by the single photolithographic step shown in FIG. 2(A). The width C is the sum of the width A of the semiconductor island layer 11a with the load MOS transistor, the width B of the semiconductor island layer 11b with the driver MOS transistor, and the width D of the isolating region between the load MOS transistor and the driver MOS transistor.

Meanwhile the width A of the semiconductor island layer 11a with the load MOS transistor formed therein is determined by the positional relationship between the resist film 14 in the step (A) and the resist film 6 in the step (B). And this width A can be reduced beyond the limit based on the photolithographic resolution.

Similarly the width D of the isolating region between the load MOS transistor and the driver MOS transistor is determined by the positional relationship between the resist film 16 in the step (B) and the resist film 17 in the step (C), and such width D can also be reduced beyond the limit based on the photolithographic resolution.

Furthermore, the width B of the semiconductor island layer 11b with the driver MOS transistor is determined by the positional relationship between the resist film 14 in the step (A) and the resist film 17 in the step (C), and the width B can also be reduced beyond the limit based on the photolithographic resolution.

Thus, the width A of the semiconductor island layer 11a, the width D of the isolating region 18 between the load MOS transistor and the driver MOS transistor, and the width B of the semiconductor island layer 11b with the driver MOS transistor are not determined by the single lithographic step respectively, but are determined by the positional relationship among the resist films 14, 16 and 17 which are formed by mutually different lithographic steps, so that each of such widths can be narrowed beyond the limit of the photolithographic resolution.

Consequently it becomes possible to diminish the area occupied by the memory cells, hence realizing an enhanced integration density of the SRAM.

It is unavoidable that, due to masking errors, some slight variations are induced in the width A of the semiconductor island layer 11a with the driver MOS transistor, and also in the width B of the semiconductor island layer 11b with the load MOS transistor. However, there exists no possibility that any harmful influence from such slight variations is exerted on the operation of the memory cell. This point will now be described below in detail.

The problem relative to the memory cell operation arises as follows in an exemplary case of reading out a "0" level signal from the node 21 shown in FIG. 3(B). When a word MOS transistor Qwl for example is turned on, a current flows into the node 21 from a bit line B charged to a "1" level, whereby the potential at the node 21 is raised. And if such potential exceeds the threshold voltage of the inverter, then the driver MOS transistor for the inverter on the opposite side with respect to the inverter having the node 21 is turned on to consequently invert the data in the memory cell. Therefore it is necessary to prevent the potential from rising above the threshold voltage.

The raised potential at the node 21 is determined by the ratio of the driving capability of the driver MOS transistor Qnl to that of the word MOS transistor Qwl, and the threshold voltage of the inverter is determined by the threshold voltage of the driver MOS transistor Qnl and that of the load MOS transistor Qpl.

Assume here that the driver MOS transistor (nMOS) and the load MOS transistor (pMOS) and the word MOS transistor (nMOS) have the following dimensions of width (W) and length (L) in $\mu$m. The numerical values enclosed with parentheses signify variations derived from masking errors.

Driver MOS transistor (nMOS): 0.44 ($\pm$0.21); 0.6
Load MOS transistor (pMOS) : 0.24 ($\pm$0.15); 0.6
Word MOS transistor (nMOS) : 0.39; 0.6

Under such conditions, the raised potential at the node and the threshold voltage of the inverter mentioned above have the dependency of FIG. 4 upon the width (Wd) of the driver MOS transistor. More specifically, the graphic representation of FIG. 4 indicates that the node potential $V_{r0}$ is raised in accordance with a decrease of the width (Wd) of the driver MOS transistor, but the variation in the width of the semiconductor island layer can be rendered free from exerting harmful influence upon the memory cell operation by properly setting the threshold voltage $V_{T0}$ of the word transistors Qw1, Qw2 to an adequate high value.

Figure 4A:
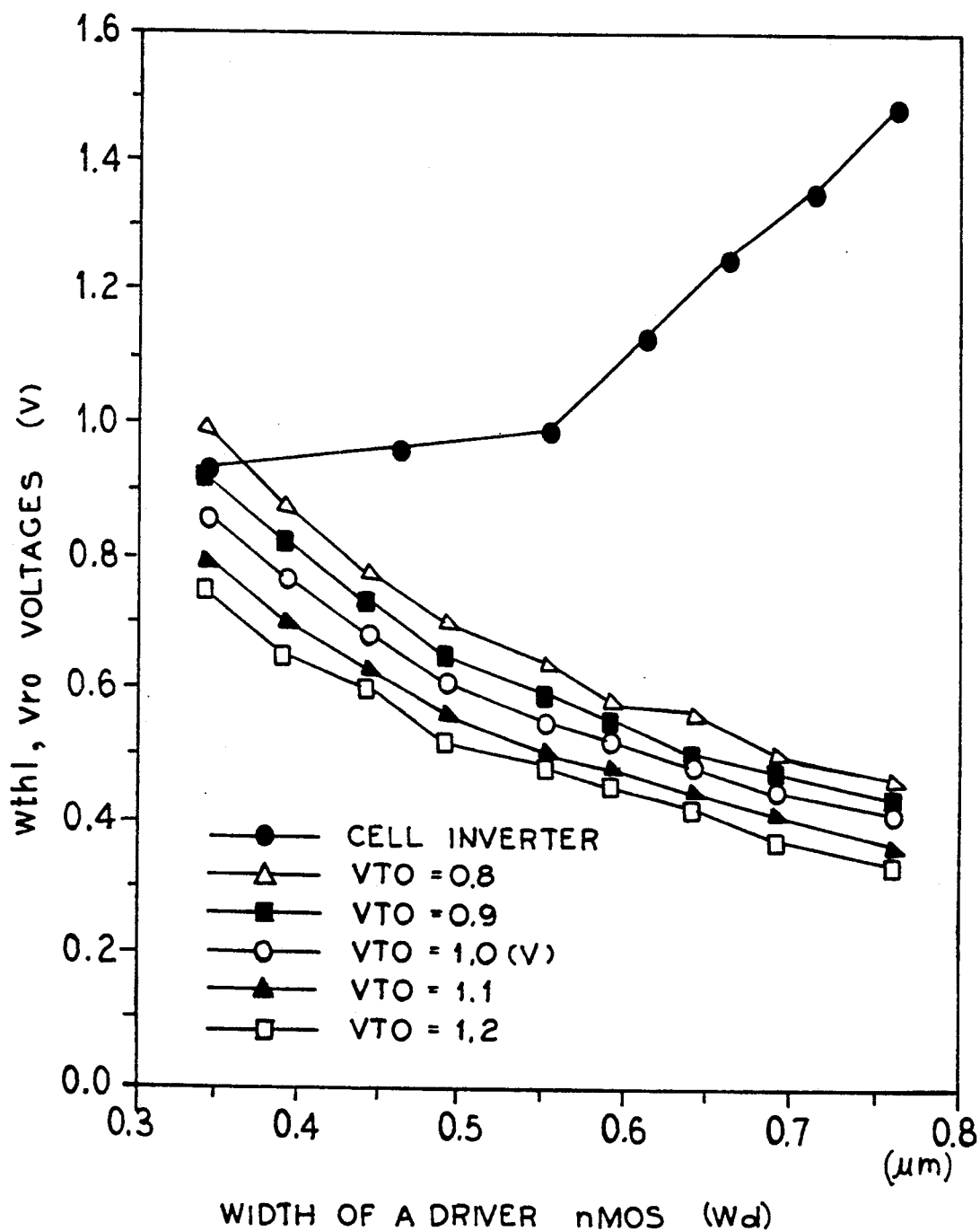
FIGS. 4(A) and 4(B) graphically show the relationship among the width (Wd) of a driver MOS transistor, a node potential and the threshold voltage of an inverter.
Figure 4B:
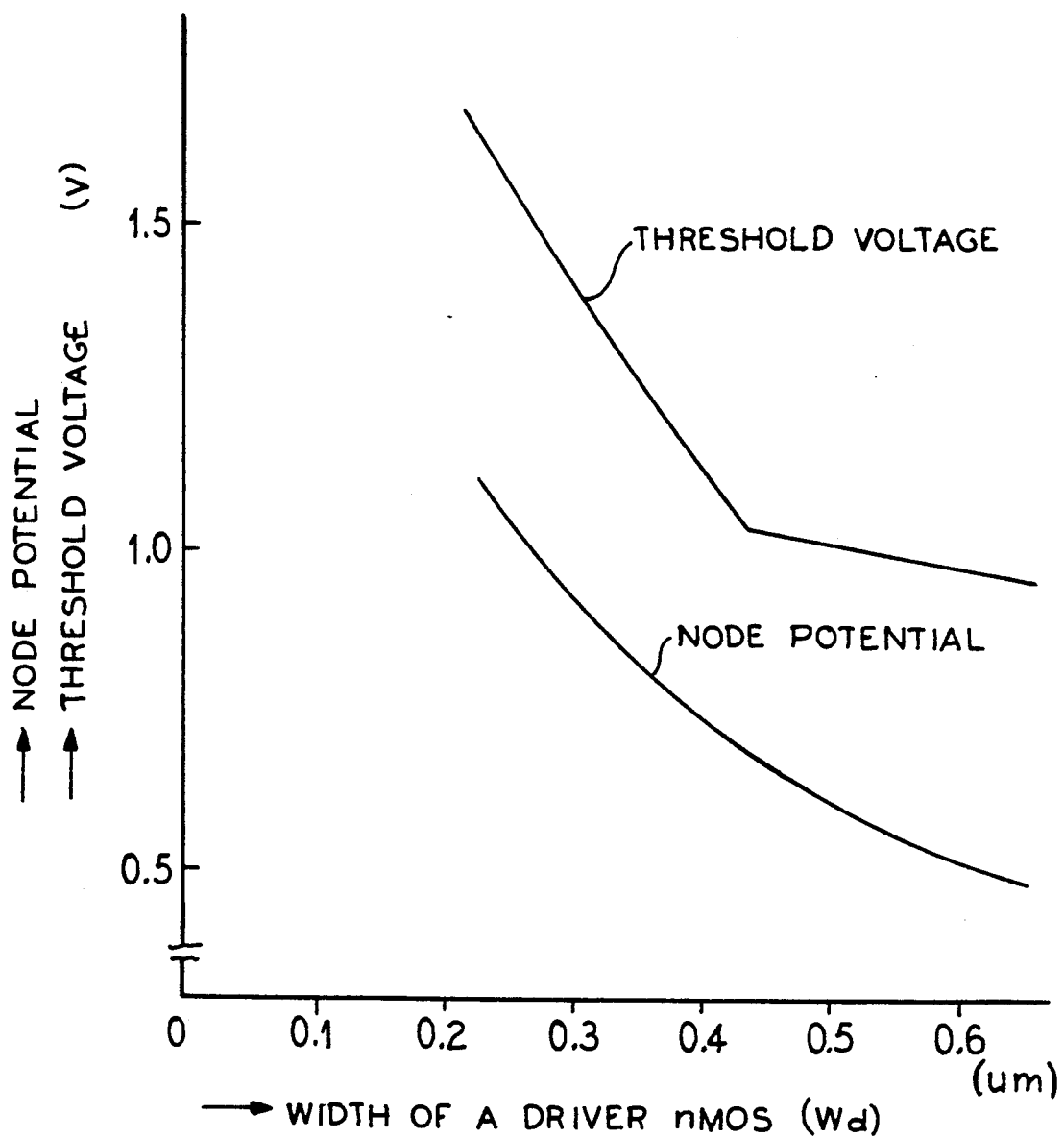

The dependency of the node potential $V_{r0}$ and the threshold voltage Vth upon the width Wd of the driver MOS transistor graphically shown in FIG. 4(A) represents the characteristics specific to the pattern arrangement of FIG. 3.

Since the n-channel and p-channel MOS transistors of two inverters constituting a memory cell are so disposed as shown in FIG. 3, the harmful influence of the masking errors to the width of the p-channel MOS transistor for example is rendered reverse with respect to each inverter. Therefore, the margin of the cell operation can be set to a greater value, as shown graphically in FIG. 4(B), by changing the memory cell disposition in such a manner that the aforementioned influences from the masking errors are equalized.

As described hereinabove, the method of the present invention for manufacture of a full CMOS type SRAM comprises the steps of forming a first mask layer on a semiconductor layer, and patterning the first mask layer by photolithography to form semiconductor island layers where a driver MOS transistor and a load MOS transistor are formable while being slightly spaced apart from each other; forming a second mask layer on the semiconductor layer inclusive of the first mask layer, and patterning the second mask layer by photolithography in such a manner as to overlap the region where one of the driver MOS transistor and the load MOS transistor in the first mask layer is formed, but not to overlap the isolating region between the driver MOS transistor and the load MOS transistor; masking, with a resist film, the region where the other of the driver MOS transistor and the load MOS transistor in the first mask layer is formed, and etching the first mask layer while masking the same with the resist film and the second mask layer; and etching the semiconductor layer while masking the same with the first mask layer, thereby forming mutually isolated semiconductor island layers where the driver MOS transistor and the load MOS transistor are formed respectively.

Therefore, according to the method of the present invention for manufacture of a full CMOS type SRAM, it becomes possible to determine the width of each semiconductor island layer, which includes the driver MOS transistor or the load MOS transistor therein, in conformity with the positional relationship between the resist masks formed by mutually different lithographic steps, hence realizing reduction of the width of each semiconductor island layer and the space of the isolating region beyond the limit based on the photolithographic resolution.

Hereinafter a second embodiment of the present invention will be described in detail.

Figure 5A:
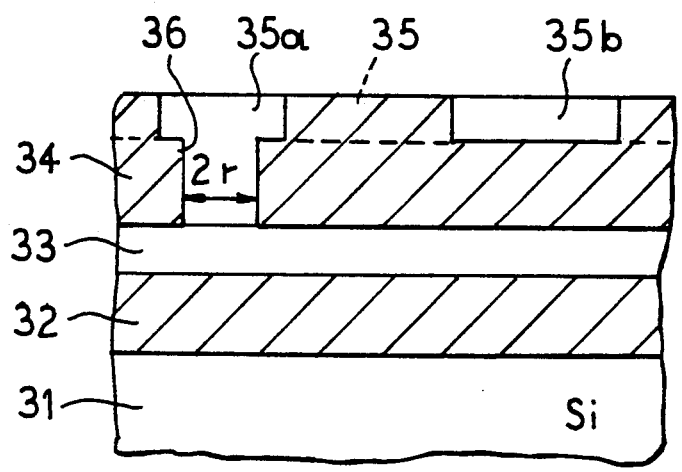
FIG. 5(A) is a sectional view of principal component elements in an embodiment where the semiconductor device of the present invention is applied to a full CMOS type SRAM.
Figure 5B:
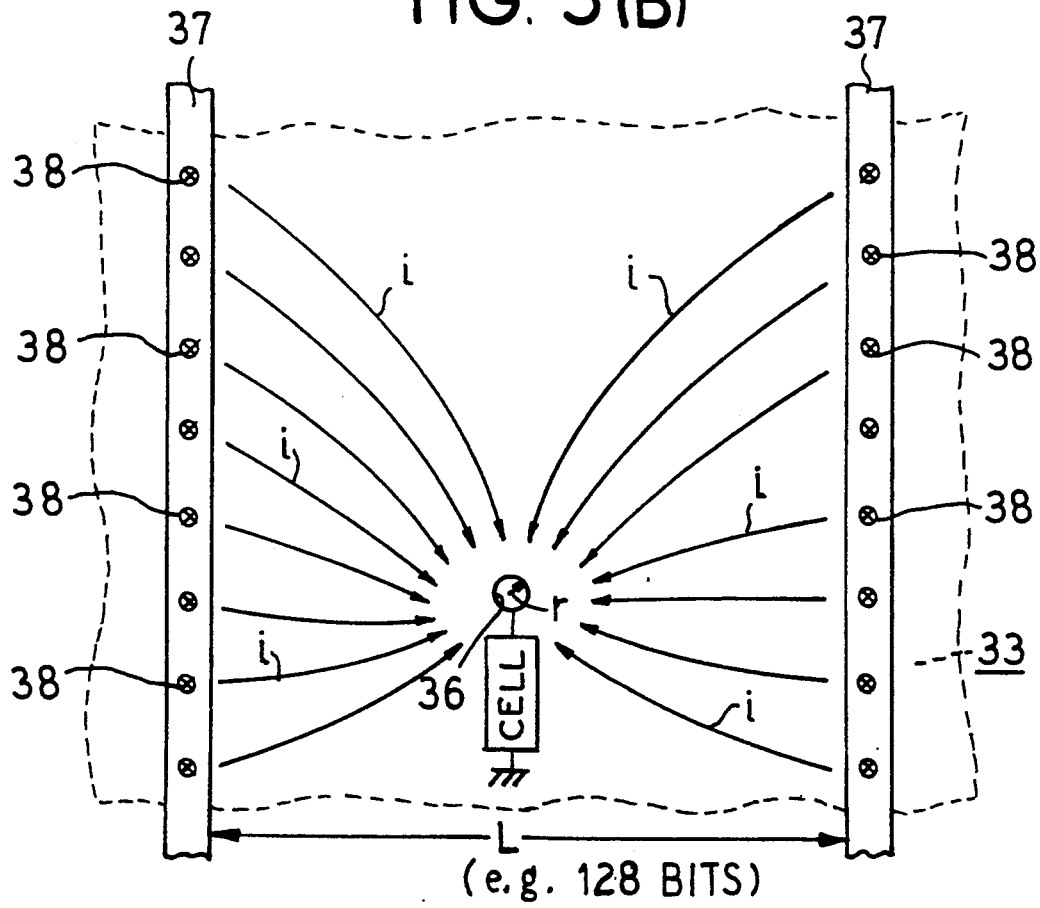
FIG. 5(B) is a plan view of the principal component elements shown in FIG. 5(A).

FIGS. 5(A) and 5(B) illustrate an example of applying the present invention to an SOI type full CMOS SRAM. In these diagrams, (A) is a sectional view of principal component elements, and (B) is a plan view thereof.

Figure 1:
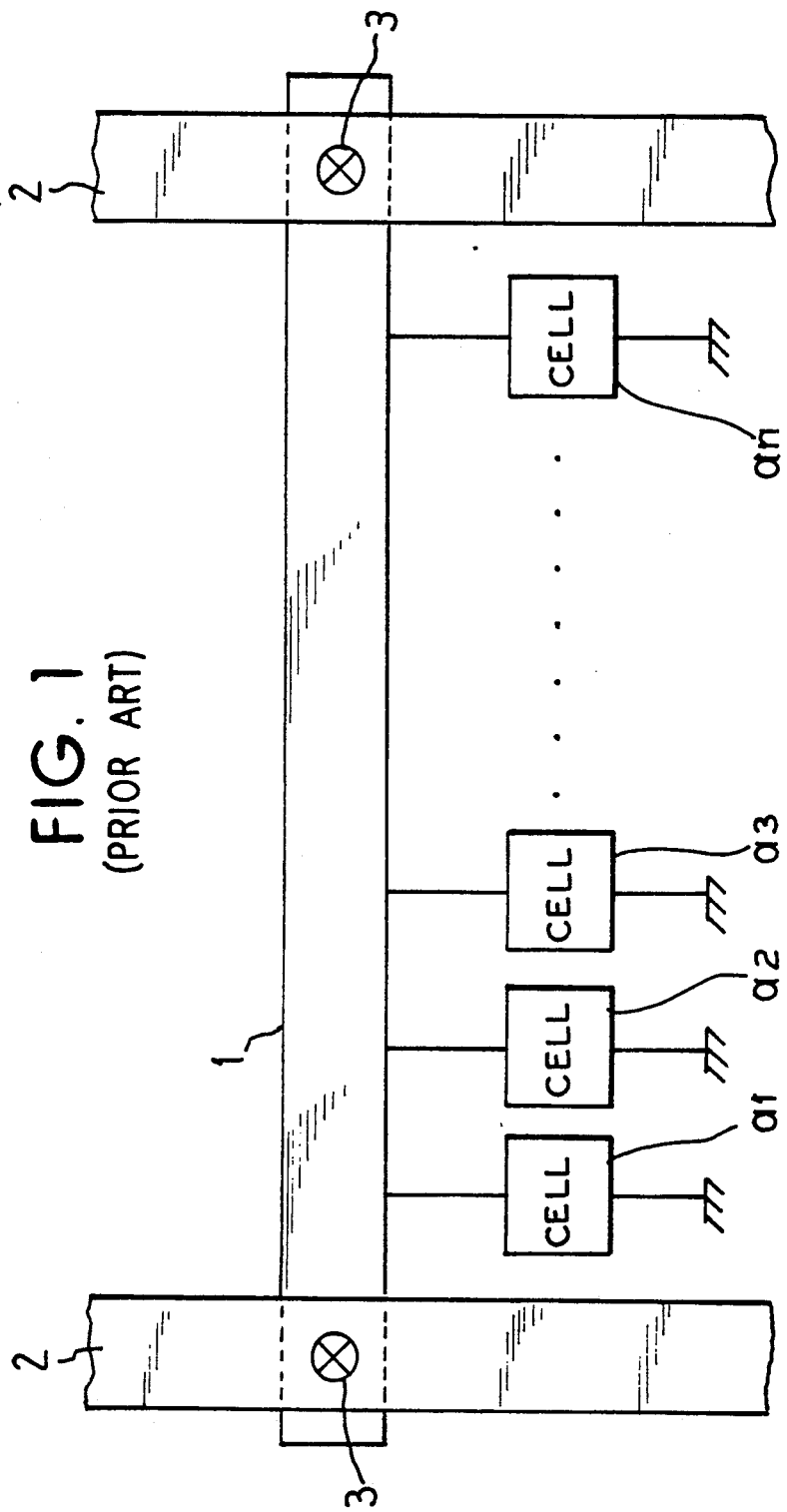
FIG. 1 is a plan view of principal component elements in a conventional semiconductor memory device.

Also shown are an SOI substrate 31 composed of silicon Si, an insulator layer 32, and a wiring layer 33 of polycrystal silicon serving as a power wiring arrangement to supply therethrough a required current from a power line 37 of aluminum to each memory cell. Namely, the wiring layer 33 functionally corresponds to the power line 1 shown in the conventional example of FIG. 1.

The wiring layer 33 of polycrystal silicon is formed substantially on the entire surface in such a manner as to cover at least the region where a memory cell array is existent, so that the resistance R of the power line can be diminished despite the relatively high sheet resistivity.

Further shown are an insulator film 34 formed as a foundation for the SOI layer formed on the wiring layer 33 of polycrystal silicon; a silicon dioxide layer 35 provided to isolate the SOI layer and furnished with MOS transistors; a source 35a of a p-channel MOS transistor in one memory cell formed in the SOI isolating layer 35; and a source 35b of an n-channel MOS transistor.

Denoted by 36 is a contact hole formed in the insulator film 34. The source 35a of the p-channel MOS transistor is connected to the wiring layer 33 through such contact hole 36.

Denoted by 37 is a power line of a second aluminum film 2Al [not shown in FIG. 5(A)] and connected to the wiring layer 33 through the contact holes 38, 38 . . . formed in the insulator film 34 and so forth. Denoted by i, i . . . are currents flowing in the individual portions toward the source of one load MOS transistor Qp taken here as an example. And the sum of such currents amounts to a write current I.

Thus, in the SRAM of the present invention, the wiring layer 33 is provided under the insulator film 34, which serves as a foundation for the SOI layer 35, in a manner to be laid substantially throughout the entire surface below at least the memory cell array, whereby the wiring layer 33 is rendered extremely wide. Consequently it becomes possible to sufficiently reduce the resistance of the power line even when the wiring layer 33 is composed of a conductive material having a relatively high sheet resistivity, such as polycrystal silicon. As a result, there is eliminated the known disadvantage that the width of the power line is limited by the ground line or the section word line as observed in the prior art, hence realizing an improved structure where the wiring layer is laid on the entire surface, to eventually widen the power line to a remarkable extent.

The power line resistance R in this embodiment is expressed as $$R \approx (Ps/2\pi) \cdot \ln(L-r)/r$$

where Ps is the sheet resistivity of the polycrystal silicon layer 33; L is the distance between the aluminum power lines 38, 38; and r is the radius of the contact hole 36 through which the source 35a of the p-channel load MOS transistor Qp is connected to the wiring layer 33. Under the conditions of L=460.8 μm (in 128 bits), r=0.3 μm and Ps=3000 Ω/square, the power line resistance R can be reduced to a considerably small value of 350 Ω or so. And such value completely satisfies the aforementioned condition of R≧1 kΩ.

Thus, according to the SRAM of this embodiment, the power line need not be composed of the first aluminum film 1Al, and the requirement in the memory cell array region is to form merely a backing word line and a ground line by using the first aluminum film 1Al, hence attaining a higher integration density in comparison with the value known in the prior art.

As described hereinabove, in the semiconductor device of the present invention, a conductive layer is formed, through an insulator layer, substantially on one entire surface of a semiconductor layer where semiconductor elements are formed, and such conductive layer is connected to the semiconductor elements via contact holes in the insulator layer to constitute a wiring arrangement.

Consequently, according to the semiconductor device of the present invention, there is achievable an improved wiring arrangement of a reduced resistance even if the conductive layer is composed of a material of a high sheet resistivity.

What is claimed is:

1. A method of manufacturing a full CMOS type SRAM, comprising the steps of:

forming a first mask layer on a semiconductor layer, and patterning said first mask layer by photolithography to form semiconductor island layers where a driver MOS transistor and a load MOS transistor are formable while being slightly spaced apart from each other;

forming a second mask layer on said semiconductor layer inclusive of said first mask layer, and patterning said second mask layer by photolithography in such a manner as to overlap the region where one of the driver MOS transistor and the load MOS transistor in said first mask layer is formed, but not to overlap the isolating region between the driver MOS transistor and the load MOS transistor;

masking, with a resist film, the region where the other of the driver MOS transistor and the load MOS transistor in said first mask layer is formed, and etching said first mask layer while masking the same with said resist film and said second mask layer; and etching said semiconductor layer while masking the same with said first mask layer, thereby forming mutually isolated semiconductor island layers where the driver MOS transistor and the load MOS transistor are formed respectively.

2. A method of manufacturing a CMOS type SRAM comprising the steps of; forming a first mask layer on a semiconductor layer, masking said first mask layer with a first resist film, etching said first mask layer to form semiconductor island layers where a driver MOS transistor and a load transistor are to be respectively formed, removing said resist film, applying a second mask layer, masking said second mask layer with a second resist film, etching said second mask layer, t cover a region where one of the driver MOS transistors and a load transistor are to be formed but not to cover an isolating region between the driver MOS transistor and the load MOS transistor, removing said second resist film, forming a third resist film which is patterned so as to completely cover a region where another MOS driver transistor and another load transistor are to be formed and not to cover a region which serves as an isolation region between the driver and load MOS transistors, etching said first mask layer to remove the isolation region between said MOS driver and load transistors, removing said third resist film and said second mask layer, and etching said semiconductor layer to form semiconductor island layers where the load MOS transistor is to be formed and where the driver MOS transistor is to be formed.

3. A method of claim 1 wherein a polycrystal silicon layer and an insulation layer are formed under said semiconductor layer on a substrate, and forming contact holes through said insulation layer to said polycrystal silicone layer, and connecting sources of said MOS driver and load transistors to said polycrystal silicon layer through said contact holes.

* * * * *